United States Patent [19]
Arimura et al.

[11] Patent Number: 5,449,937
[45] Date of Patent: Sep. 12, 1995

[54] FIELD EFFECT TRANSISTOR WITH SHORT CHANNEL AND MANUFACTURING METHOD THEREFOR

[75] Inventors: Motoharu Arimura; Alberto O. Adan, both of Tenri, Japan

[73] Assignee: Sharp Kabushiki Kaisha, Osaka, Japan

[21] Appl. No.: 391,465

[22] Filed: Feb. 21, 1995

Related U.S. Application Data

[63] Continuation of Ser. No. 214,201, Mar. 16, 1994, abandoned.

[30] Foreign Application Priority Data

Mar. 19, 1993 [JP] Japan ................. 5-60091

[51] Int. Cl.⁶ ............... H01L 33/00; H01L 29/161
[52] U.S. Cl. ..................... 257/345; 257/344; 257/336
[58] Field of Search .............. 257/345, 344, 336

[56] References Cited

FOREIGN PATENT DOCUMENTS

| | | | |
|---|---|---|---|
| 3-204940 | 9/1961 | Japan . | |
| 54-121071 | 9/1979 | Japan ................ | 257/345 |
| 61-23366 | 1/1986 | Japan . | |
| 62-133763 | 6/1987 | Japan ................ | 257/344 |
| 2-105469 | 4/1990 | Japan . | |
| 2-122568 | 5/1990 | Japan . | |

OTHER PUBLICATIONS

Odanaka et al, "A New Half Micron p-Channel MOSFET", *IEEE Trans or ED*, vol. ED-33, No. 3, Mar. 1986, pp. 317–321.

Young, "Metal Oxide Semi—Conductor FET...,", IBM Tech, vol. 17, #4, Sept. 1974, pp. 128–129.

Krieger et al, "Shadowing Effects due to Tilter As...Implant", *IEEE Trans on ED*, vol. 36, #11, Nov. 1989, pp. 2458–2461.

"A Novel Source-to-Drain Nonuniformly Doped Channel (NUDC) MOSFET for High Current Drivability and Threshold voltage Controllability", Y. Okumura et al., LSI R & D Laboratory, Mitsubishi Electric Corp., Japan, 1990 IEEE.

*Primary Examiner*—Ngân V. Ngô
*Assistant Examiner*—Stephen D. Meier
*Attorney, Agent, or Firm*—Nixon & Vanderhye

[57] ABSTRACT

On a p-type semiconductor substrate (well region) there are arranged apart from each other an n-type source region and an n-type drain region, a channel region therebetween, and a gate electrode. A pair of p-type channel diffusion regions doped more heavily than the substrate are formed along the channel boundary between the source region and the drain region and the substrate. The channel diffusion region below the drain region is doped with an n-type impurity to achieve a lower active impurity concentration relative to that in the channel diffusion region below the gate electrode.

9 Claims, 13 Drawing Sheets

FIELD EFFECT TRANSISTOR WITH SHORT CHANNEL AND MANUFACTURING METHOD THEREFOR

This is a continuation of application Ser. No. 08/214,201, filed Mar. 16, 1994, now abandoned.

BACKGROUND OF THE INVENTION

The present invention relates to a field effect transistor, and more particularly, to a field effect transistor having a channel length on the order of a submicron order.

It is known that when the channel length of a field effect transistor is on the order of a submicron or less, the short channel effect effect the threshold voltage towards zero and, as a result, increases the drain current (leakage current) when the transistor is in the cutoff condition.

Figure 9:
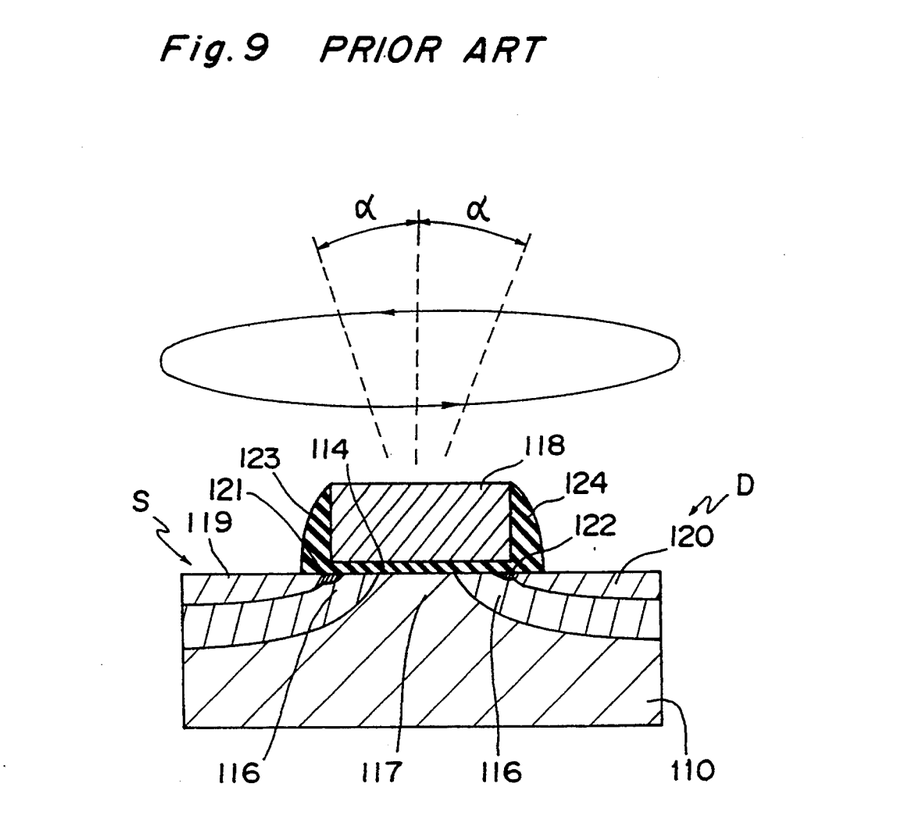
FIG. 9 is a sectional view of a conventional field effect transistor.

In order to avoid the short channel effect, there is proposed a field effect transistor having a channel unevenly doped as shown in FIG. 9. The field effect transistor is constructed so that a gate insulating film 114 and a gate electrode 118 are formed on a surface of a p-type silicon substrate (or well region) 110, and then tilt-angle rotational ion implantation ($\alpha$: tilt-angle of implantation) is effected with the gate electrode 118 used as a mask to form p-type heavily doped regions 116 under about one third of the gate electrode width from both edges of the gate electrode 118. Ions are further implanted into surface portions of the silicon substrate 110 approximately perpendicularly to the surface to form n-type lightly doped regions 121 and 122 on both sides of the gate electrode 118. Subsequently, SiO$_2$ side walls 123 and 124 are provided on both sides of the gate electrode 118, and then ions are implanted into surface portions of the silicon substrate 110 approximately perpendicularly to the surface to form n-type heavily doped regions 119 and 120. The n-type lightly doped region 121 and the n-type heavily doped region 119 constitute a source region S, while the n-type lightly doped region 122 and the n-type heavily doped region 120 constitute a drain region D (LDD (Lightly Doped Drain) structure). In the field effect transistor, the p-type heavily doped regions (channel diffusion regions) 116 are provided at both ends of a channel region 117. Therefore, the possible widening of a depletion layer may be suppressed at the boundaries of the source region S and the drain region D to allow the short channel effect to be suppressed.

Figure 12A:
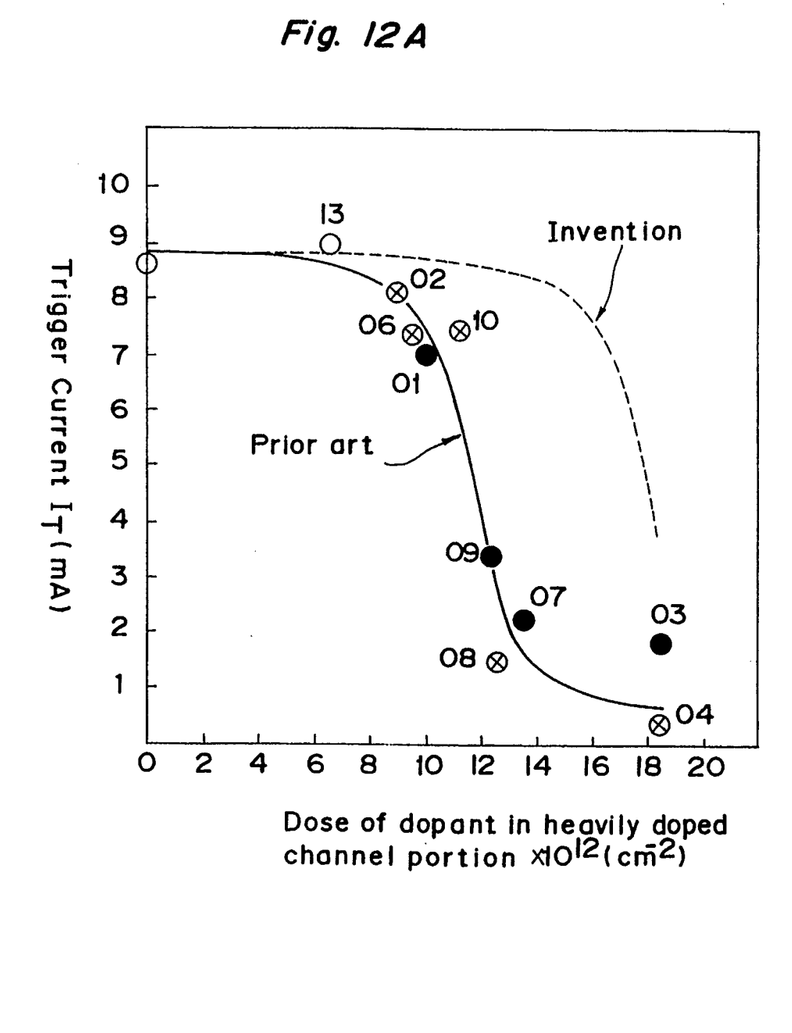
FIGS. 12A and 12B are graphs showing respectively a relation between trigger current causing latch-up and the dose of dopant in the channel portion, and a definition of the trigger current.
Figure 12B:
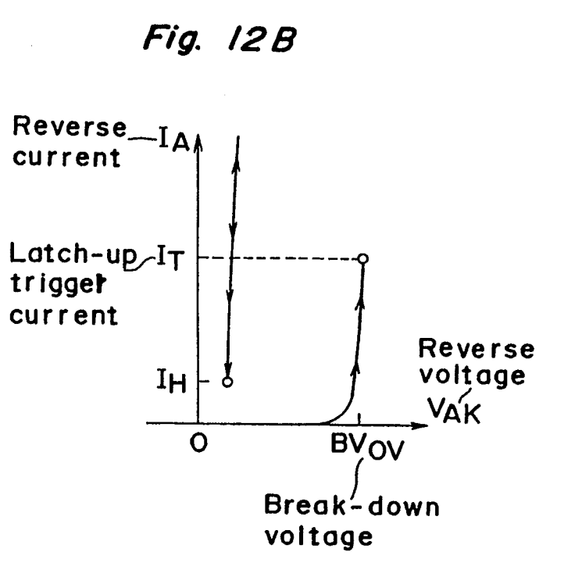

However, in the above-mentioned conventional field effect transistor, the width the depletion layer is limited by the p-type heavily doped region 116. As a result an endurance voltage at the junction between the drain region D and the silicon substrate 110 is reduced. Furthermore, the junction capacitance between the drain region D and the silicon substrate 110 increases which reduces the response speed of the transistor and reduces the trigger current causing latch-up as shown in FIGS. 12A and 12B.

Figure 10A:
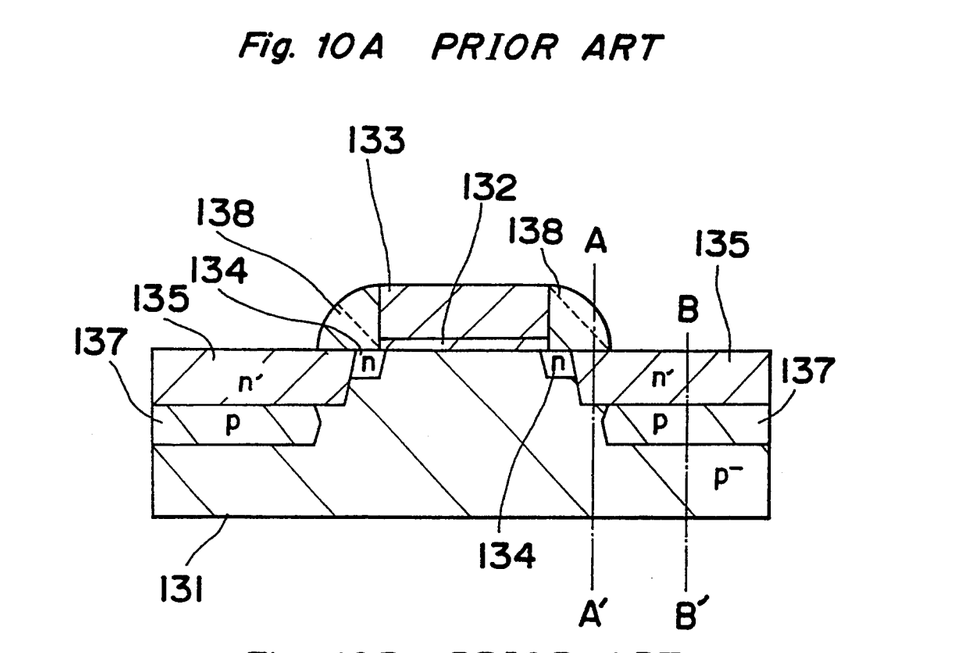
FIGS. 10A and 10B are views showing respectively a sectional view of another conventional field effect transistor and its impurity concentration distributions in the depthwise direction.
Figure 10B:
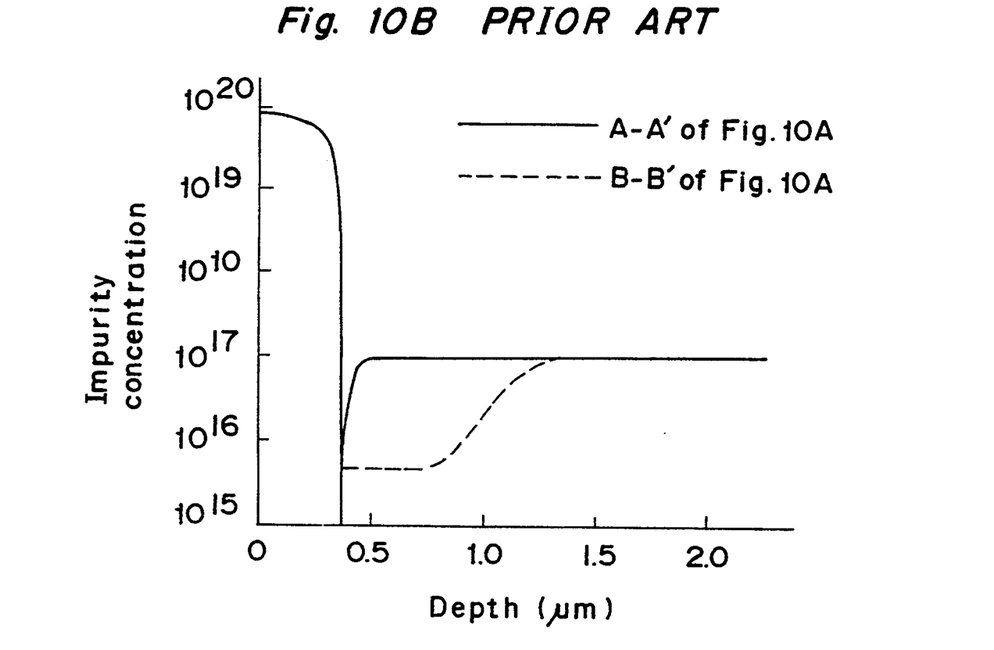

To suppress the increase of the junction capacitance between the drain region and the silicon substrate, a field effect transistor such as shown in FIG. 10A may be constructed including a semiconductor substrate 131 of a conductivity type (p- or n-type), a gate insulating film 132 and a gate electrode 133 formed on the substrate 131, source and drain regions composed of diffusion layers 134, 135 of opposite conductivity type (n- or p-type) arranged in contact with edge portions of the gate insulating film 132, and a diffusion layer 137 of the same conductivity type as the semiconductor substrate 131 is arranged in contact with the source and drain regions and apart from a channel region with an impurity concentration greater than the impurity concentration of the semiconductor substrate 131. Since the above transistor does not have a heavily doped region at either side of the channel region, the widening of the depletion layer is not suppressed at the boundaries of the drain region and the source region which results in losing control of the short channel effect.

If the lightly doped diffusion layer 137 expands to a portion beneath the channel region, the impurity concentration in the gate is reduced which results in losing control of the short channel effect. In order to prevent the above-mentioned phenomenon, the channel region and the lightly doped diffusion layer 137 are separated from each other in the above transistor.

Figure 11:
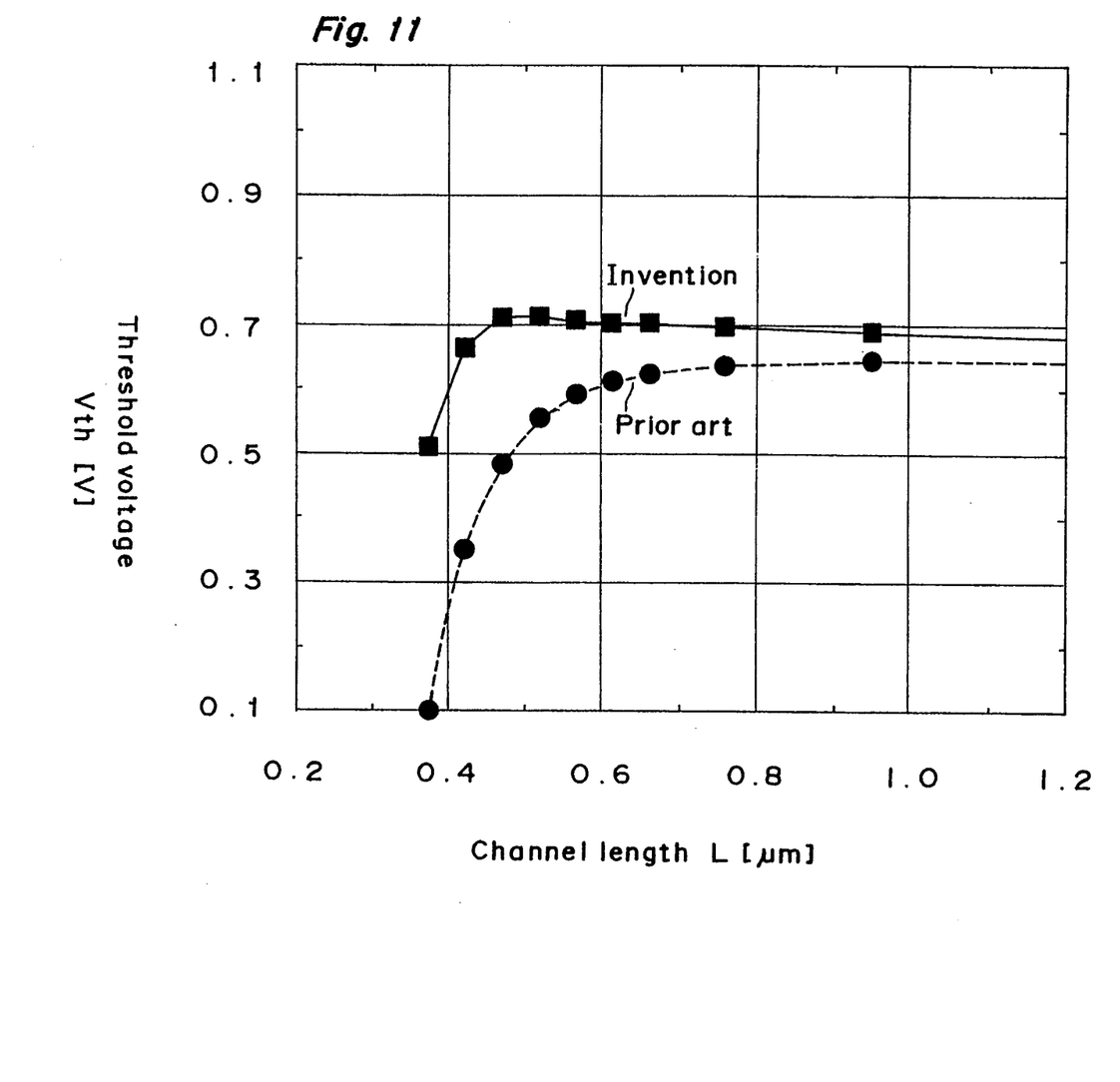
FIG. 11 is a graph showing the short channel effect as manifested in threshold voltage Vth.

In order to obtain the above-mentioned separated structure, the lightly doped diffusion region 137 is formed during a side wall formation process, or otherwise a photoresist is required as a mask to achieve the intended distance from the channel region. Therefore, the process is complicated. In the latter case in particular, a self-aligning arrangement not having the benefit of the gate electrode including a side wall 138 used as a mask is difficult to achieve with a margin of error on the submicron order. Also, in the above transistor, the short channel effect occurs when the channel length is on the order of a submicron as shown in FIG. 11.

Another problem is the lightly doped diffusion region 137 and the channel region must be separated apart from each other in order to prevent the lightly doped diffusion region 137 from expanding into the channel region. In order to obtain the above-mentioned separated structure, the side wall formation process is executed two times to separate the lightly doped diffusion region from the channel region, or a photoresist is provided as a mask to result in the disadvantages of complicated process and reduced process margin.

SUMMARY OF THE INVENTION

The object of the present invention is therefore to provide a field effect transistor having a channel length on the submicron order and a manufacturing method therefor capable of suppressing the short channel effect, increasing the endurance voltage at the junction between the drain and the semiconductor substrate, and improving the speed of response of the transistor appropriate for submicron transistor manufacturing without reducing the latch-up trigger current.

In order to achieve the aforementioned object, a field effect transistor of the present invention comprises:
- a semiconductor substrate of a first conductive type;
- source and drain regions of a second conductive type arranged apart from each other on the substrate;
- gate electrode provided on a channel region between the source region and the drain region, whose edge portions in a direction of the channel are superposed on the source region and the drain region; and
- a channel diffusion region formed along a boundary between the drain region and the substrate so as to extend from below the drain region to a region below the gate electrode, which is doped with an impurity of the first conductive type more heavily than the substrate in order to suppress a short channel effect;

wherein a portion of the channel diffusion region below the drain region is doped with an impurity of the second conductive type to have lower active impurity concentration than that in a portion of the channel diffusion region below the gate electrode.

A method for manufacturing a field effect transistor comprises the steps of:

a) forming a gate insulating film on a surface of a semiconductor substrate of a first conductive type and forming a gate electrode on the gate insulating film, said gate electrode having a predetermined dimension;

b) ion-implanting an impurity of the first conductive type into the surface of the substrate at a tilt angle thereto using the gate electrode as a mask so as to form a channel diffusion region extending from one side of the gate electrode to under the gate electrode, said channel diffusion region having an impurity concentration higher than that of the substrate;

c) ion-implanting an impurity of a second conductive type into the surface of the substrate approximately perpendicularly to the surface using the gate electrode as a mask so as to form drain and source regions in the substrate and on both sides of the gate electrode; and d) ion-implanting an impurity of the second conductive type at approximately the same dose as that in the step b) into the surface of the substrate approximately perpendicularly thereto under an acceleration energy such that a center in depth of the impurity ion-implanted is placed at a position deeper than a depth of the source and drain regions and shallower than a depth of the channel diffusion region so as to reduce the implanted active impurity of the first conductive type in a portion of the channel diffusion region underlying the drain region.

Since the field effect transistor of the present invention has a heavily doped diffusion region, whose dopant is the same type as the semiconductor substrate in the channel portion, the short channel effect can be suppressed in the same manner as in the conventional case. In the channel diffusion region, the portion just below the drain region is doped with the opposite type of dopant to have an active impurity concentration lower than the portion just below the gate electrode in the channel diffusion region. Therefore, the depletion layer is allowed to easily widen between the drain region and the semiconductor substrate. Also, the heavily doped diffusion region in the channel portion prevents the lightly doped diffusion region from expanding into the channel portion. As a result, the electric field is moderated to increase the endurance (breakdown) voltage at the junction between the drain region and the semiconductor substrate. Furthermore, the junction capacitance between the drain region and the semiconductor substrate is reduced to improve the speed of response of the transistor.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The following describes in detail a field effect transistor and a manufacturing method therefor in accordance with several embodiments of the present invention.

Figure 1A:
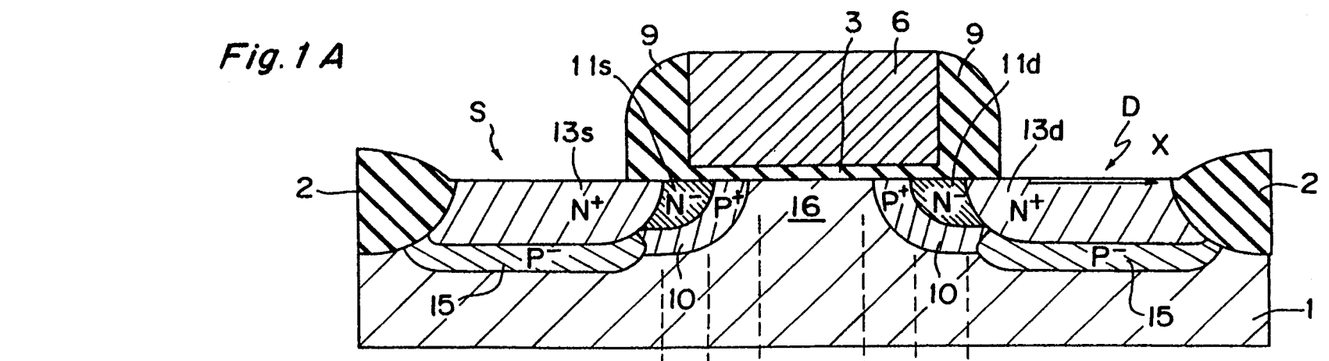
FIGS. 1A and 1B are sectional views of a field effect transistor and a graph showing the impurity concentration distribution along the channel respectively in accordance with an embodiment of the present invention.

FIG. 1A shows a sectional view of a field effect transistor in accordance with an embodiment of the present invention.

Figure 1B:
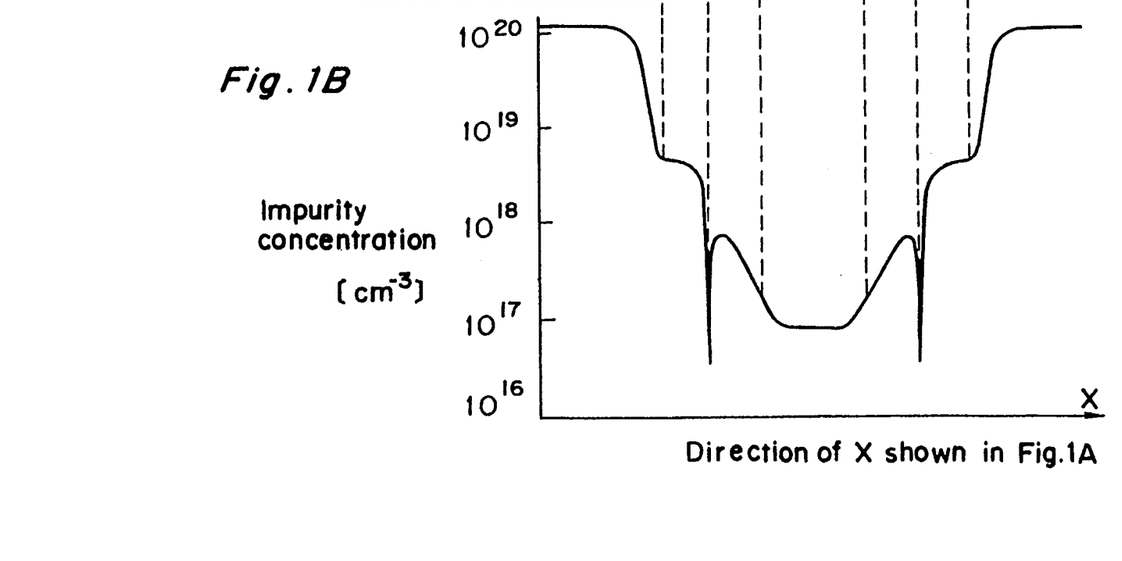

The field effect transistor has on a p-type silicon substrate (well region) 1 a source region S composed of an n-type lightly doped region 11s and an n-type heavily doped region 13s, and a drain region D composed of an n-type lightly doped region 11d and an n-type heavily doped region 13d. On a channel region 16 between the source region S and the drain region D, there is provided via a gate oxide film 3 a gate electrode 6 having edge portions in the direction of the channel superposed on the source region S and the drain region D. Along the boundaries between the n-type lightly doped region 11s and the n-type lightly doped region 11d and the silicon substrate 1, there is formed a pair of channel diffusion regions 10 and 10 extending respectively from below the n-type heavily doped region 13s and the n-type heavily doped region 13d to regions below the gate electrode 6. Each channel diffusion region 10, being the same conductivity type as the well region 1, is unevenly doped with an impurity more heavily than the well region 1 as shown in FIG. 1B (FIG. 1B shows the impurity concentration in the direction of x along the surface of the silicon substrate 1). The channel diffusion region 10 suppresses, the short channel effect. The field effect transistor includes p-type lightly doped regions 15 formed below the n-type heavily doped regions 13s and 13d by reducing the impurity concentration of the channel diffusion regions 10 in a manner as described hereinafter.

The field effect transistor is produced in a manner as follows.

Figure 5A:
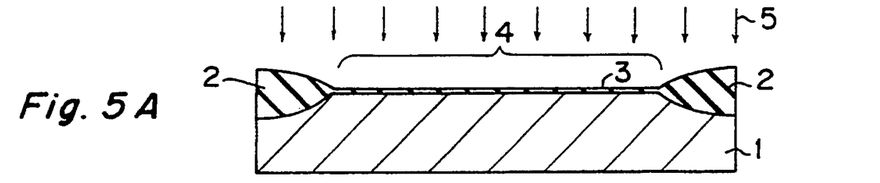
FIGS. 5A through 5F are process flow diagrams for explaining the method for manufacturing the field effect transistor.

(1) First, in a manner as shown in FIG. 5A, an element isolating region 2 is formed on a surface of the p-type silicon substrate (well region) 1 to define an active region 4. On the active region 4, a thin oxide film (film thickness: 10 to 50 nm) (not shown) is formed. Note that the impurity concentration in the well region 1 is $10^{16}$ to $10^{17}$ at/cm$^3$.

(2) Then a p-type impurity 5 is implanted into the surface of the silicon substrate 1 approximately perpendicularly to the surface to adjust the threshold voltage of the surface of the active region (channel region) 4. The ion type of the p-type impurity 5 is boron for instance, the acceleration energy is 10 to 40 kev, and the dose is $10^{11}$ to $10^{13}$ ions/cm$^2$.

Figure 5B:
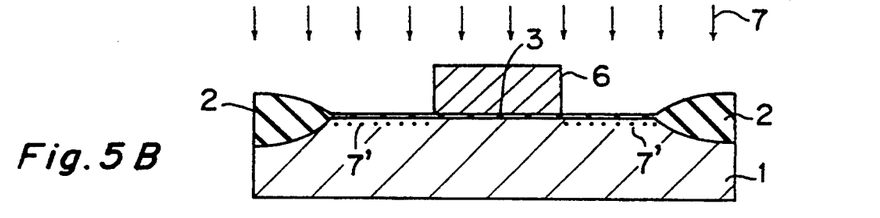

(3) Then in a manner as shown in FIG. 5B, after removing the thin oxide film on the active region 4, a gate oxide film S is formed on the surface of the active region 4 by the thermal growth method. The gate oxide film has a film thickness of 7 to 10 nm (corresponding to a setup value of 0.3 μm of the channel length).

(4) Then a polysilicon film is deposited on the entire surface of the gate oxide film 3 by the pressure reduction CVD method, and the polysilicon film is processed by photolithography and etching to form a gate electrode 6 having specified dimensions. Note that the gate electrode 6 may be composed of two layers of a metal having a high melting point such as tungsten, molybdenum, or titanium and polysilicon instead of being formed singly of the polysilicon layer.

(5) Then ions of an n-type impurity 7 are implanted into the surface of the silicon substrate 1 approximately perpendicularly to the surface with the gate electrode 6 used as a mask. The ion type of the n-type impurity 7 is phosphorus for instance, the acceleration energy is 20 to 50 kev, and the dose is $10^{12}$ to $10^{14}$ ions/cm$^2$. The implanted n-type impurity 7' forms the n-type lightly doped regions 11s and 11d constituting a part of the source and drain regions (shown in FIG. 5D).

Figure 5C:
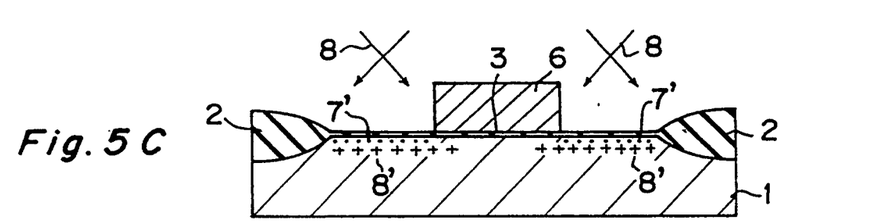
Figure 5D:
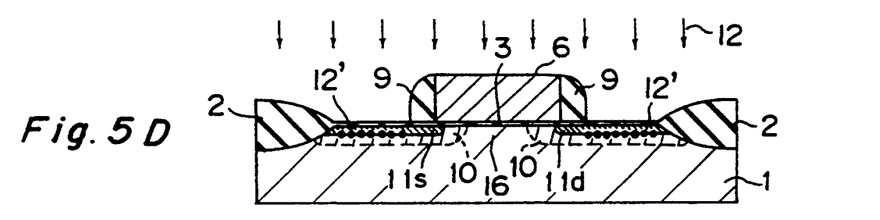

(6) Then in a manner as shown in FIG. 5C, ions of a p-type impurity 8 are implanted into the surface of the silicon substrate 1 at a tilt angle with respect to the surface with the gate electrode 6 used as a mask (tilt-angle rotational ion implantation). In the above stage, with the angle of implantation set at 15 to 45 degrees with respect to the normal line of the surface of the silicon substrate 1, the silicon substrate 1 is rotated in steps at every specified angle around the normal line of the gate electrode 6. The ion type of the p-type impurity is boron for instance, the acceleration energy is 30 to 100 kev, and the dose is $10^{12}$ to $10^{13}$ ions/cm$^2$. The implanted p-type impurity 8' forms unevenly doped channel diffusion regions (p-type heavily doped regions) 10 extending about one third of the width of the gate electrode 6 from both sides of the electrode under the gate electrode 6 in a manner as shown in FIG. 5D. The p-type heavily doped regions 10 also extend below the n-type lightly doped regions 11s and 11d.

Note that the process (6) for forming the unevenly doped channel diffusion regions 10 may be executed first and the process (5) for forming the n-type lightly doped diffusion regions 11s and 11d may be executed afterwards.

Figure 5E:
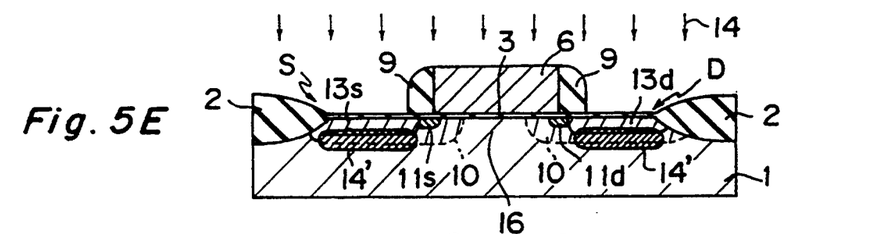

(7) Then in a manner as shown in FIG. 5D, side walls 9 and 9 made of SiO$_2$ are formed on both sides of the gate electrode 6 by a known technique. Subsequently, ions of an n-type impurity 12 are implanted into the surface of the silicon substrate 1 approximately perpendicularly to the surface with the gate electrode 6 and the SiO$_2$ side walls 9 used as a mask. The ion type of the n-type impurity 12 is arsenic for instance, the acceleration energy is 30 to 50 kev, and the dose is $10^{14}$ to $10^{16}$ ions/cm$^2$. Through the above processing, an n-type impurity 12' is implanted in a portion on the surface of the substrate on both sides of the side walls 9 and 9. The implanted n-type impurity 12' forms the n-type heavily doped regions 13s and 13d respectively outside the n-type lightly doped regions 11s and 11d as shown in FIG. 5E. The n-type lightly doped region 11s and the n-type heavily doped region 13s constitute the source region S, while the n-type lightly doped region 11d and the n-type heavily doped region 13d constitute the drain region D (LDD structure).

Figure 3:
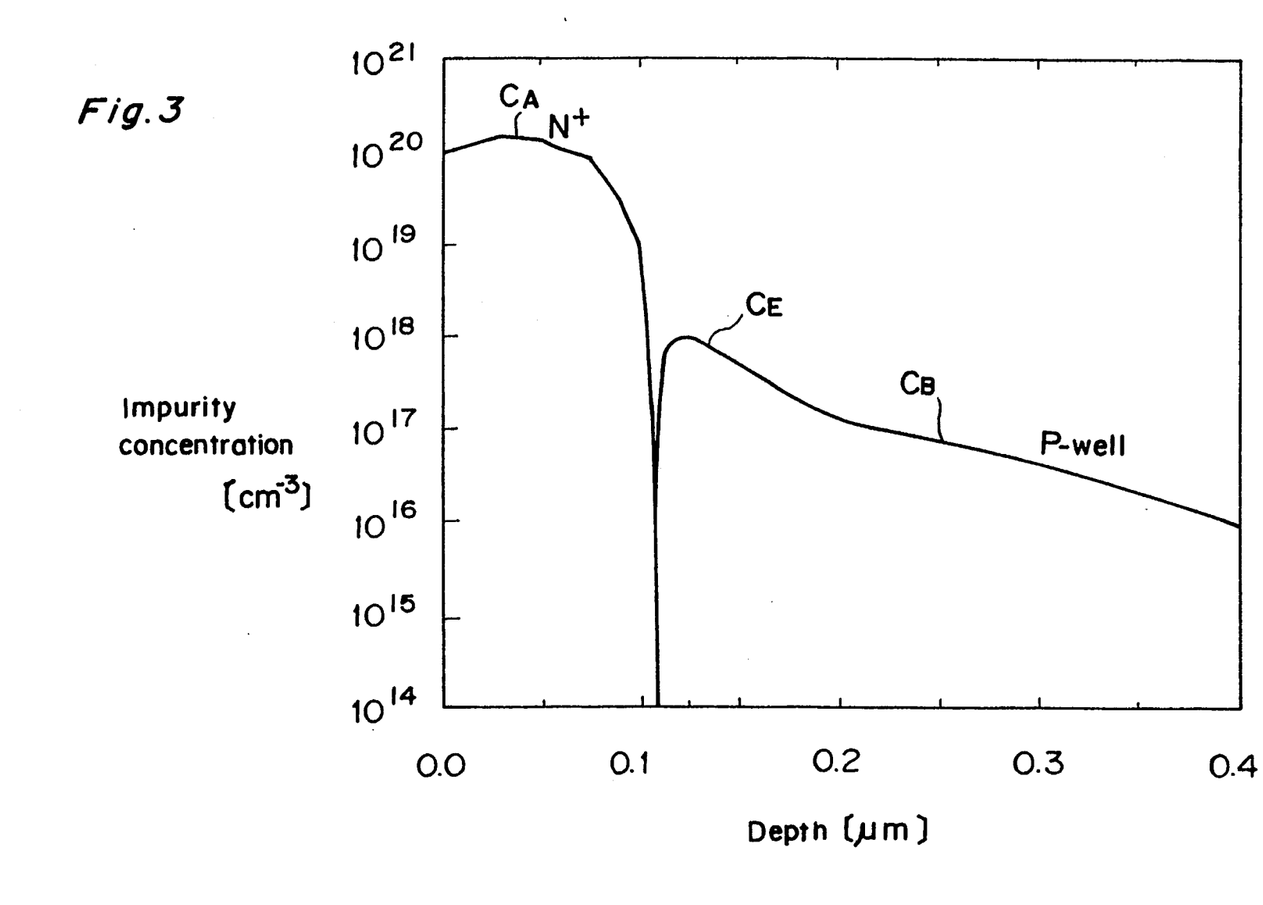
FIG. 3 is a graph showing the impurity concentration distribution in the depthwise direction at the source/drain region of the field effect transistor in the manufacturing process.

When the impurity concentration in the vicinity of the surface of the drain region D is viewed in the depth-wise direction at this stage, there is a state as shown in FIG. 3. In detail, an n-type heavily doped portion C$_A$ corresponding to the n-type heavily doped region 13d is taking place in the range of depth from 0.0 μm to 0.1 μm, and a p-type heavily doped portion C$_E$ corresponding to the p-type heavily doped region 10 is taking place in the range of depth from 0.1 μm to 0.2 μm. At a depth not smaller than 0.2 μm, a portion C$_B$ corresponding to the impurity concentration of the well region 1 is taking place.

Figure 13:
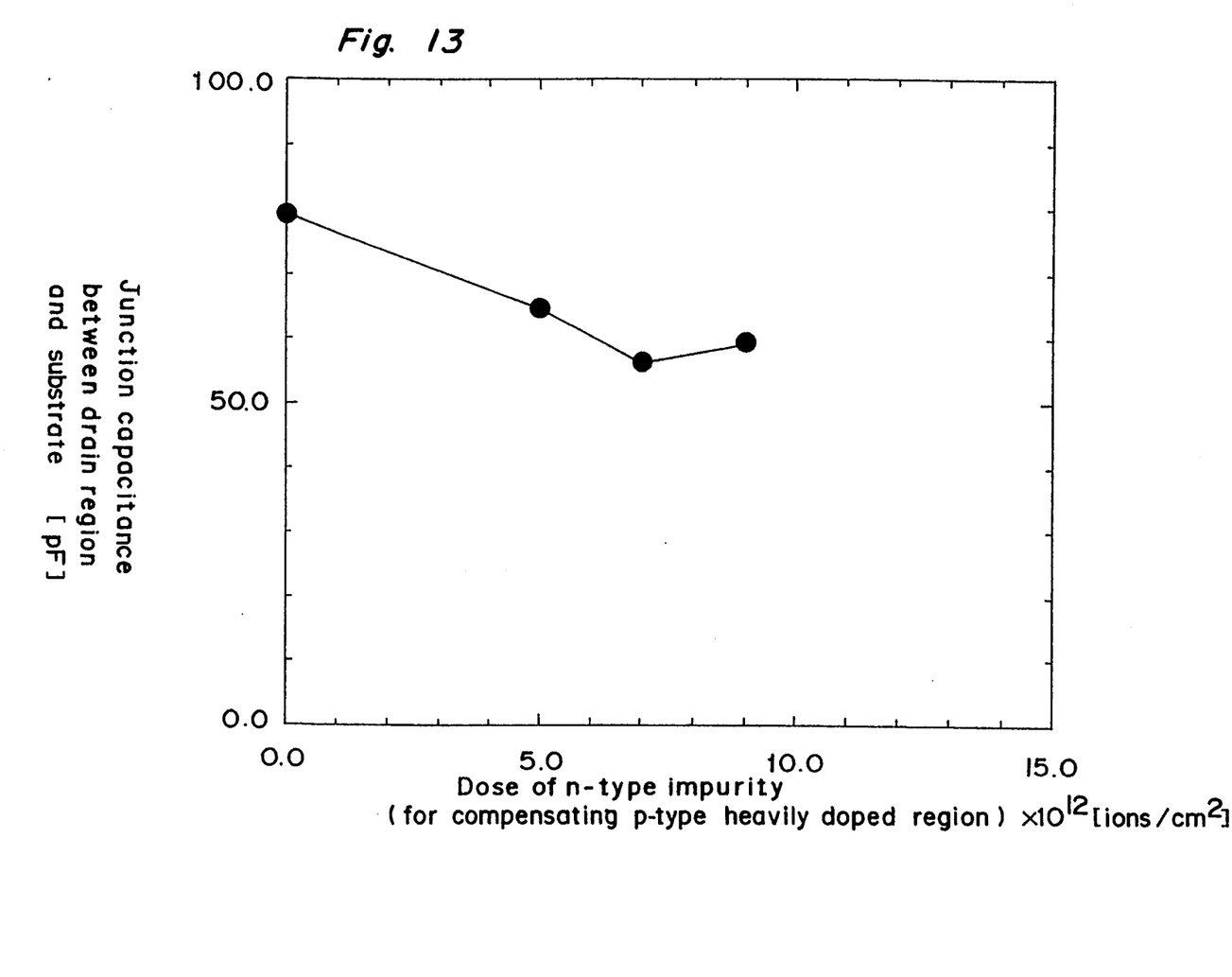
FIG. 13 is a graph showing a relation between the junction capacitance between the drain region and the substrate, and the dose of the n-type impurity (for compensating the p-type heavily doped region) of the present invention.

(8) Then in a manner as shown in FIG. 5E, ions of an n-type impurity 14 are implanted into the surface of the silicon substrate 1 approximately perpendicularly to the surface using the gate electrode 6 and the SiO$_2$ side walls 9 as a mask by setting the acceleration energy so that the center Rp in depth of implantation is placed at a position deeper than the depth of the n-type heavily doped regions 13s and 13d and shallower than the depth of the channel diffusion regions 10 (the deepest portion shown by the dotted lines in the figures). In the above stage, the dose of the n-type impurity is set approximately at the same dose of the p-type impurity 8 as shown in FIG. 5C so as to compensate for the p-type heavily doped region 10. The above arrangement is adopted because junction capacitance between the drain region and the substrate is minimized by setting the dose of the n-type impurity approximately at the same dose as the p-type impurity 8 as shown in FIG. 13.

Figure 5F:
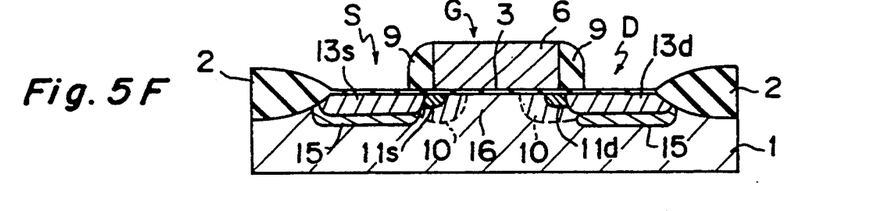

In detail, in the present example, the center Rp in depth of implantation was Rp=0.12 μm, and the radius of distribution was ΔRp=0.05 μm. The ion type of the n-type impurity 14 is phosphorus for instance, the acceleration energy is 50 to 100 kev, and the dose is $10^{12}$ to $10^{14}$ ions/cm$^2$. The implanted n-type impurity 14' compensates for the p-type heavily doped region 10 between the n-type heavily doped regions 13s and 13d and the well region 1. In other words, the implanted n-type impurity reduces in quantity the active impurities in the region. Consequently, the region is transformed into the p-type lightly doped region 15 as shown in FIG. 5F.

Figure 2:
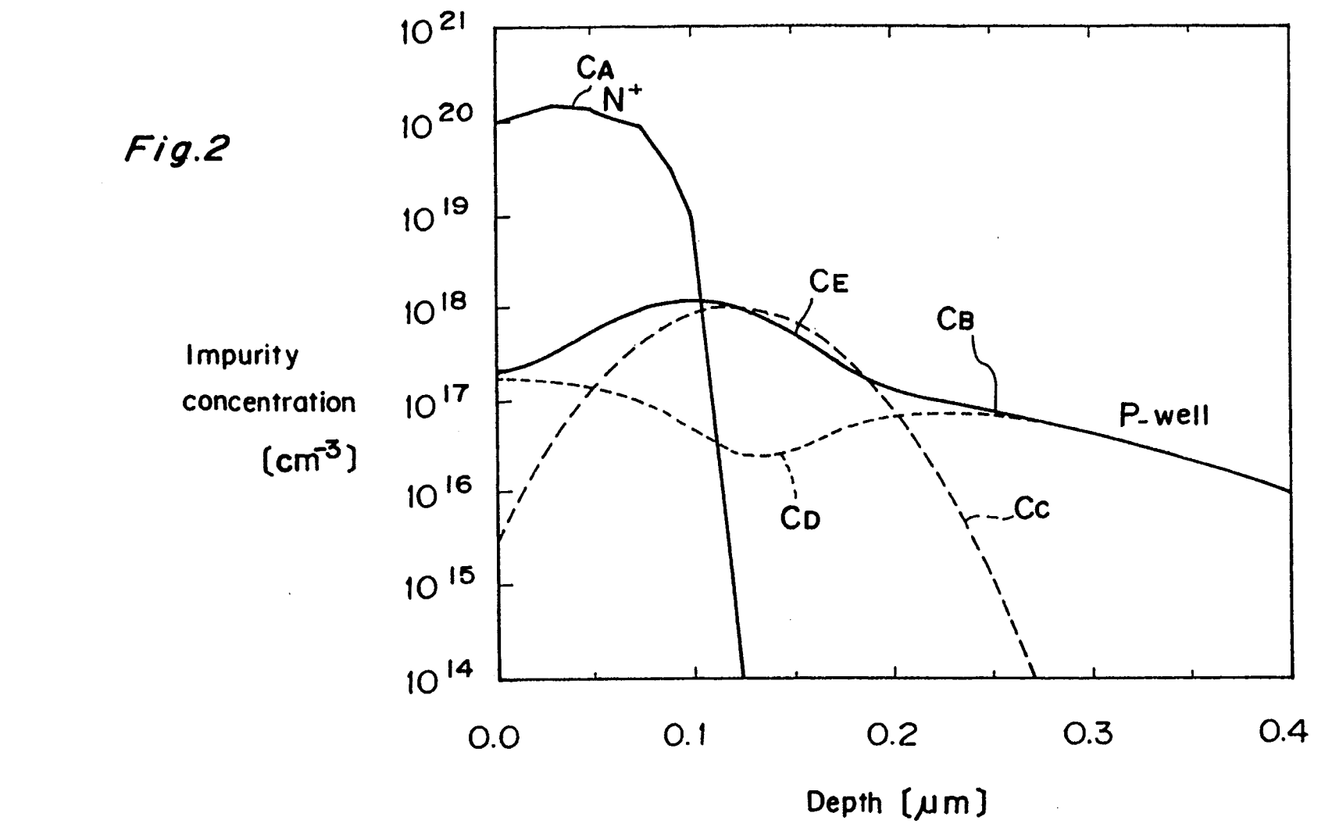
FIG. 2 is a graph collectively showing the impurity concentration distribution in the depthwise direction at the source/drain region of the field effect transistor.
Figure 4:
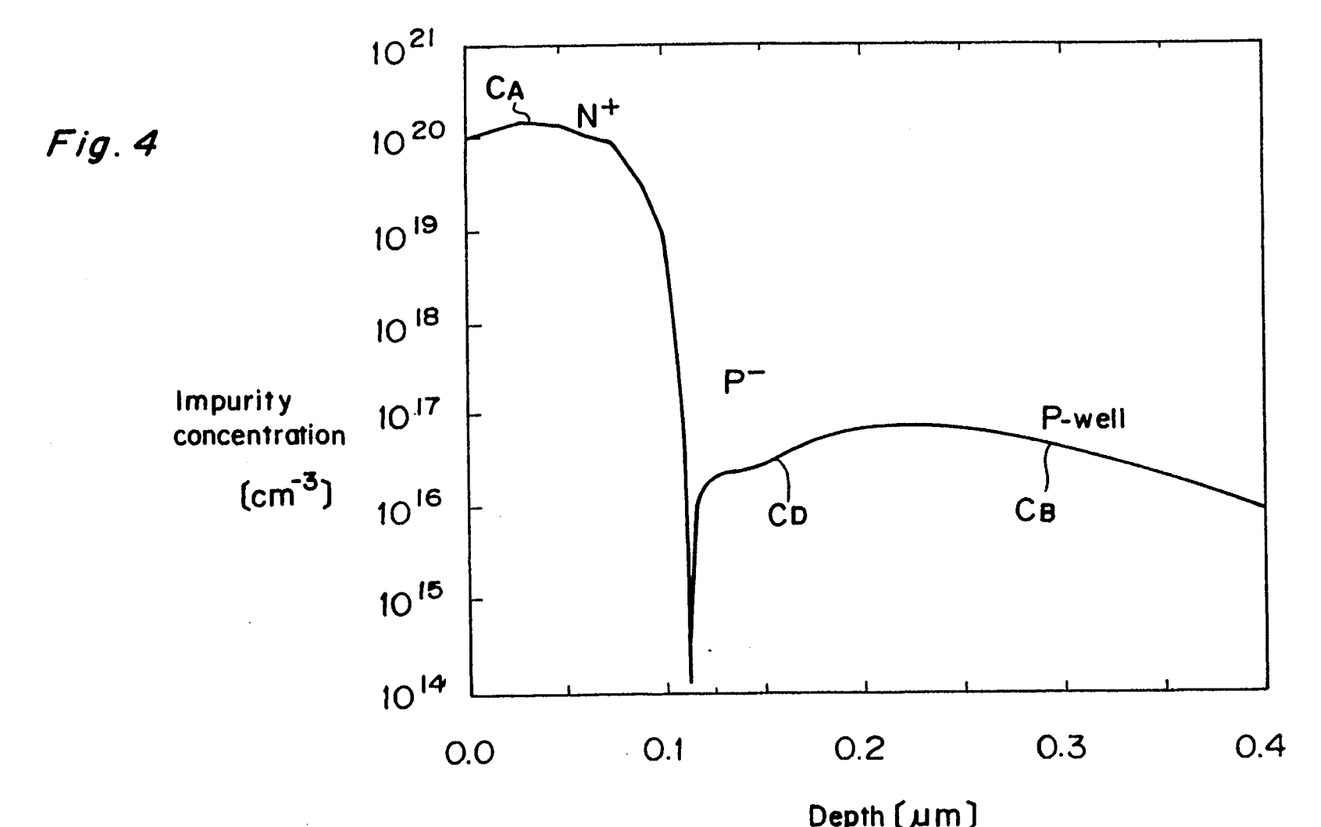
FIG. 4 is a graph showing the impurity concentration distribution in the depthwise direction at the source/drain region of the field effect transistor in the manufacturing process.

When the impurity concentration in the vicinity of the surface of the drain region D is viewed in the depthwise direction at this stage, there is a state as shown in FIG. 4. In detail, an n-type heavily doped portion $C_A$ corresponding to the n-type heavily doped region 13d occurs in the range of depth from 0.0 μm to the depth of 0.1 μm in the same manner as in the process (7) (FIG. 3). However, a p-type lightly doped portion $C_D$ corresponding to the p-type lightly doped region 15 is taking place in the range of depth from 0.1 μm to 0.2 μm. At a depth at 0.2 μm or more, a portion $C_B$ corresponding to the impurity concentration of the well region 1 occurs. From a collective point of view shown in FIG. 2, as a consequence of subtracting the concentration $C_C$ of the n-type impurity for compensation from the p-type heavily doped portion $C_E$, the p-type lightly doped portion $C_D$ was formed. The central value of the impurity concentration in the n-type heavily doped region 13d is $10^{20}$ at/cm$^3$, the central value of the impurity concentration in the p-type-lightly doped region 15 is $10^{16}$ at/cm$^3$, and the central value of the impurity concentration in the well region 1 is $10^{16}$ at/cm$^3$.

According to the above-mentioned procedure, as shown in FIG. 1A, there can be produced a field effect transistor having the p-type lightly doped regions 15 formed in between the n-type heavily doped regions 13s and 13d and the p-type silicon substrate (well region) 1.

Figure 8:
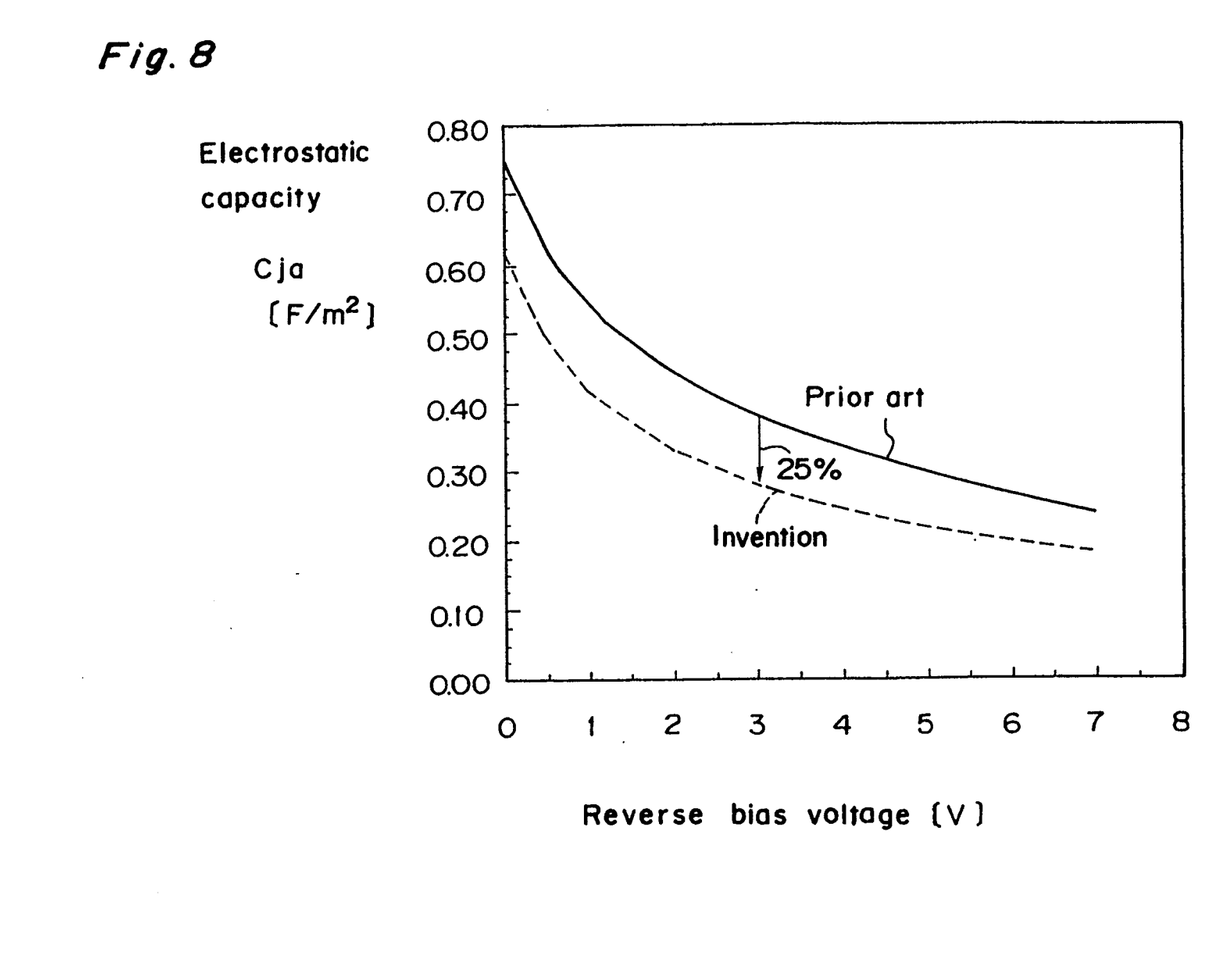
FIG. 8 is a graph showing the electrostatic junction capacitance between the drain and the substrate of the field effect transistor shown in FIG. 1.

By virtue of the existence of the p-type lightly doped region 15, the width depletion layer is allowed to increase between the drain region D and the silicon substrate 1. As a result, the electric field can be moderated to increase the endurance voltage at the junction. Furthermore, the junction capacitance can be reduced to improve the speed of response of the transistor. Actually as shown in FIG. 8, the electrostatic capacity between the drain region D and the silicon substrate 1 was reduced by about 25% as compared with the conventional case.

Figure 6A:
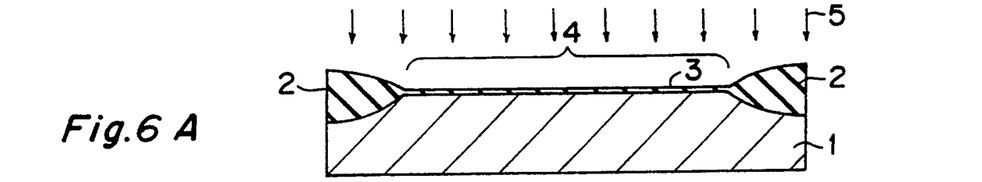
FIGS. 6A through 6F are process flow diagrams for explaining the method for manufacturing a field effect transistor in accordance with another embodiment of the present invention.
Figure 6B:
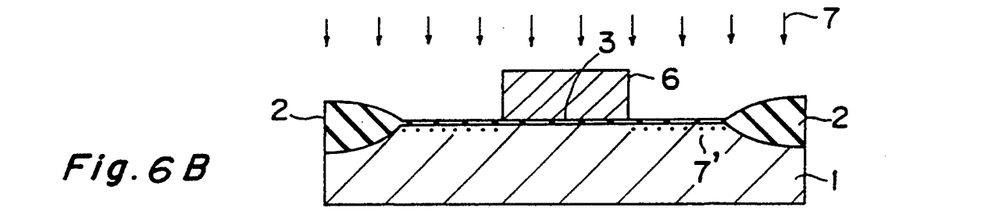
Figure 6C:
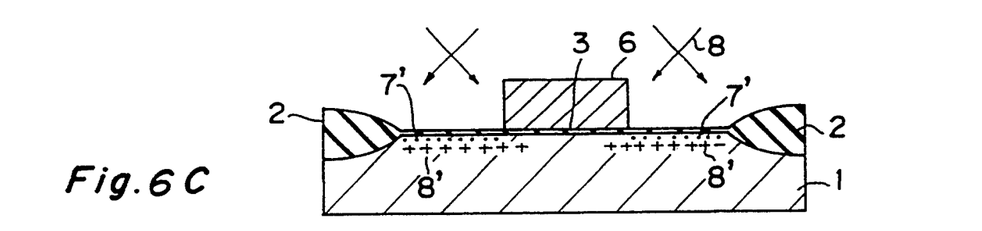
Figure 6D:
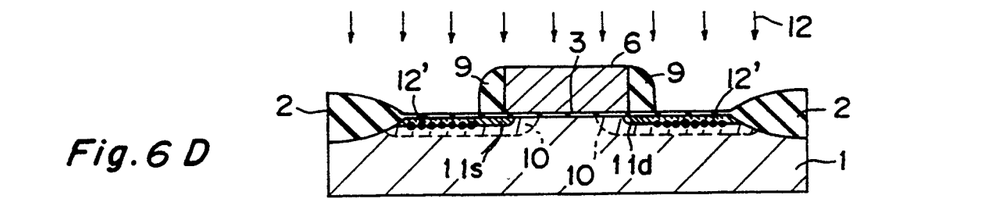
Figure 6E:
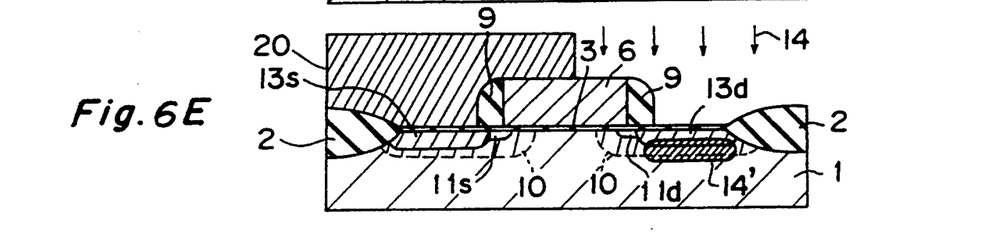
Figure 6F:
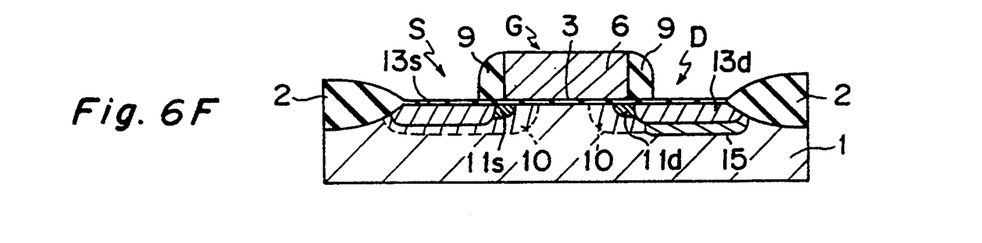

Although the p-type lightly doped region 15 is formed in both the source region S and the drain region D in the aforementioned embodiment, the p-type lightly doped region 15 may be formed only in the drain region D since a bias is typically only applied to the drain region D in operation. In such a case, the same processes as the aforementioned processes (1) through (7) are executed quite in the same manner as shown in FIGS. 6A through 6D, and when the n-type impurity 14 for the compensation of the impurity concentration is implanted in a manner as shown in FIG. 6E, the source region S is masked with a resist 20 to allow the impurity to be implanted only into the drain region D. With the above-mentioned arrangement, the p-type lightly doped region 15 can be formed only in the drain region D as shown in FIG. 6F.

Figure 7A:
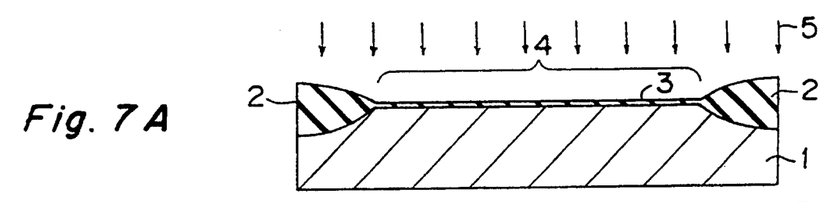
FIGS. 7A through 7F are process flow diagrams for explaining the method for manufacturing a field effect transistor in accordance with another embodiment of the present invention.
Figure 7B:
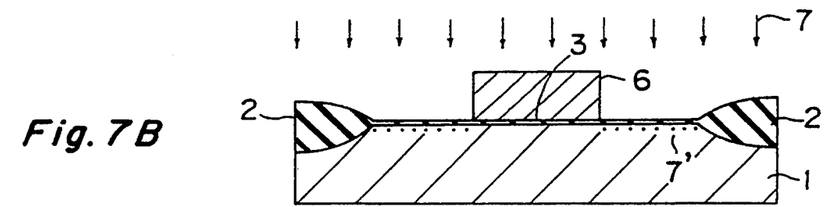
Figure 7C:
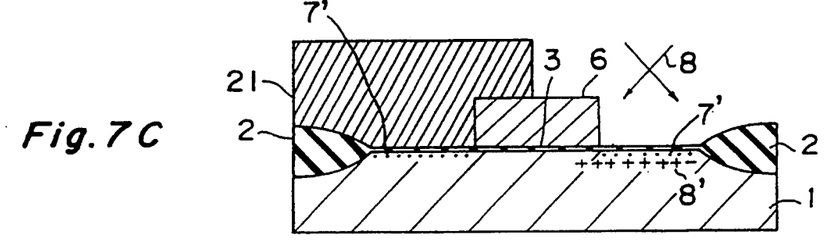
Figure 7D:
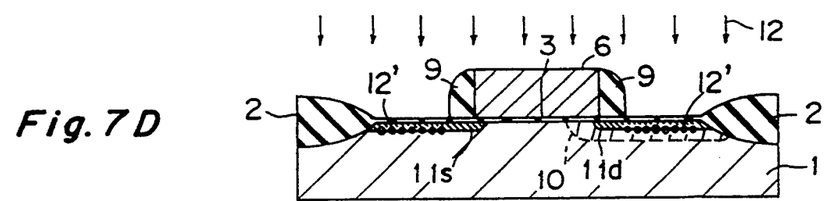
Figure 7E:
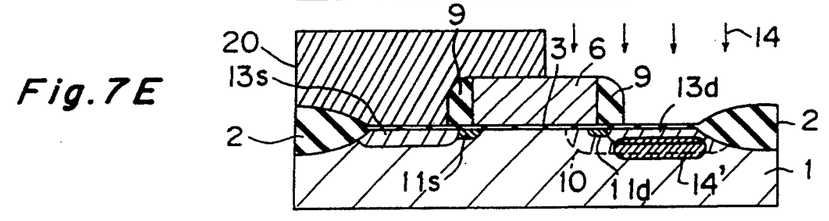
Figure 7F:
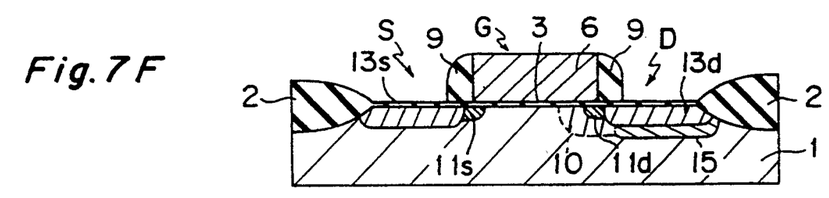

The unevenly doped channel diffusion region (p-type heavily doped region) 10 may be formed only on the side of the drain D. In such a case, the same processes as the aforementioned processes (1) through (5) are executed quite in the same manner as shown in FIGS. 7A through 7D, and when the p-type impurity 8 for the formation of the unevenly doped channel is implanted in a manner as shown in FIG. 7C, the source region S is masked with a resist 21 to allow the impurity to be implanted only into the drain region D. With the above-mentioned arrangement, the channel diffusion region (p-type heavily doped region) 10 can be formed only in the drain region D as shown in FIG. 7D. Furthermore, when the n-type impurity 14 for the compensation of the impurity concentration is implanted in a manner as shown in FIG. 7E, the source region S is masked with a resist 20 to allow the impurity to be implanted only into the drain region D.

Although the p-type lightly doped region 15 is provided in a field effect transistor having the LDD structure in the aforementioned embodiment, the arrangement is of course not limitative. The present invention can be also applied to a field effect transistor which does not have the n-type lightly doped regions 11s and 11d.

The present invention can also be applied to a field effect transistor having a structure in which the p-type and n-type conductivities are exchanged for each other with respect to the example shown in FIG. 1.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A field effect transistor comprising:
   a semiconductor substrate of a first conductivity type;
   source and drain regions of a second conductivity type arranged apart from each other on the substrate;
   a gate electrode provided on a channel region between the source region and the drain region, whose edge portions superpose on the source region and the drain region; and
   a channel diffusion region formed along an entire boundary which exists between the drain region and the substrate extending from below the drain region up to and even with a surface of the semiconductor substrate next to a portion of the channel region below the gate electrode such that the channel diffusion region completely separates the drain region from the substrate;
   wherein one portion of the channel diffusion region separates a side portion of the drain region from the channel region and is doped with an impurity of the first conductivity type more heavily than the substrate in order to suppress a short channel effect;
   wherein another portion of the channel diffusion region below the drain region has a first conductivity impurity concentration less than an impurity concentration of the substrate.

2. A field effect transistor as claimed in claim 1, further comprising:
   another channel diffusion region formed along the boundary between the source region and the substrate extending from below the source region to a region below the gate electrode, which is doped with an impurity of the first conductive type more heavily than the substrate in order to suppress a short channel effect.

3. The field effect transistor according to claim 1, wherein the channel region is on the order of 0.3 μm in length.

4. The field effect transistor according to claim 1, wherein the channel region is less than 0.5 μm in length.

5. A field effect transistor comprising:
  a semiconductor substrate of first conductivity type;
  a source and a drain of second conductivity type formed in the substrate and separated by a channel of the first conductivity type;
  a gate electrode formed on the substrate over the channel; and
  a channel diffusion region completely separating the drain from the substrate including a first portion beneath the drain having an impurity concentration lower than an impurity concentration of the substrate and second portion next to the first portion, extending beneath part of the gate electrode up to and even with a surface of the substrate to completely separate a side portion of the drain from the substrate and having a first conductivity type impurity concentration greater than the substrate impurity concentration.

6. The field effect transistor according to claim 5 wherein the drain is divided into two drain regions, a first drain region having a heavily-doped impurity of the second conductivity type and a second drain region having a lightly-doped impurity of the second conductivity type.

7. The field effect transistor according to claim 5 further comprising:
  another channel diffusion region separating the source from the substrate and the channel including another first portion beneath the source having an impurity concentration lower than an impurity concentration of the substrate and another second portion next to the another first portion and extending beneath part of the gate electrode having a first conductivity type impurity concentration greater than the substrate impurity concentration.

8. The field effect transistor according to claim 5, wherein the channel is less than 0.5 $\mu$m in length.

9. The field effect transistor according to claim 5, wherein the channel is on the order of 0.3 $\mu$m in length.

* * * * *